United States Patent [19]

Kimura

[11] 4,249,987

[45] Feb. 10, 1981

[54] METHOD OF GROWING LARGE $PB_{1-x}$-$SN_x$-TE SINGLE CRYSTALS WHERE $0<X<1$

[75] Inventor: Hiroshi Kimura, Chatsworth, Calif.

[73] Assignee: Hughes Aircraft Company, Culver City, Calif.

[21] Appl. No.: 679,270

[22] Filed: Apr. 22, 1976

Related U.S. Application Data

[63] Continuation of Ser. No. 486,277, Jul. 8, 1974, abandoned.

[51] Int. Cl.[3] .............................................. B01J 17/02

[52] U.S. Cl. .................................... 156/603; 156/619; 156/DIG. 72; 156/DIG. 85; 156/DIG. 110; 252/62.3 V

[58] Field of Search ..................... 252/62.3 V, 62.3 R; 23/295, 301 R, 305; 75/166 D; 156/603, 619, 624, DIG. 72, 85, 110

[56] References Cited

U.S. PATENT DOCUMENTS

| | | | |
|---|---|---|---|
| 3,615,928 | 10/1971 | Wagner et al. | 252/62.3 V X |
| 3,622,399 | 11/1971 | Johnson | 156/603 |
| 3,723,190 | 3/1973 | Kruse et al. | 252/62.3 V X |
| 3,849,205 | 11/1974 | Brau et al. | 252/62.3 V X |

*Primary Examiner*—Jack Cooper

*Attorney, Agent, or Firm*—Booker T. Hogan, Jr.; W. H. MacAllister

[57] ABSTRACT

Large single crystals of $Pb_{1-x}$-$Sn_x$-Te are grown in a near-equilibrium condition by applying a minimal driving force such that a high degree of growth reliability is achieved. The process utilized allows the growth mechanism to take place approximately 50° C. below the melting point of the charge materials. Crystals grown by this process are ultra pure and exhibit substantially improved compositional and crystallographic homogenuity throughout.

2 Claims, 7 Drawing Figures

24
22
30
20
28
26
950
Temp.°C 90
34

Distance from Top of Furnace, In.
14
15
16
17
18
19
20
850
860
870
Temperature, °C
50
48
46
36
38
40
34
42
44

METHOD OF GROWING LARGE $PB_{1-x}$-$SN_x$-TE SINGLE CRYSTALS WHERE $0<X<1$

This is a continuation of application Ser. No. 486,277, filed July 8, 1974, now abandoned.

RELATED APPLICATIONS

Application Ser. No. 376,869, and Ser. No. 375,417, filed July 5, 1973 and July 2, 1973, respectively, by Hiroshi Kimura are related to the present invention. This invention is a substantial improvement over application Ser. No. 376,869 which is directed to a similar crystal growth process.

BACKGROUND OF THE INVENTION

1. Field of the Invention

This invention is related to crystal growth processes in general and to the growth of large single crystals of lead tin telluride in particular.

2. Description of the Prior Art

The phase diagram of lead tin telluride (FIGS. 1 and 2) indicates a narrow separation of the liquidus and solidus curves, thereby enabling the advantageous use of several prior art crystal growth methods. Such methods include the Bridgman-Stockbarger, Czochralski, vapor transport. All these methods have been relatively successful in producing bulk single crystals of lead tin telluride; however, they are deficient in one or more respects.

In the Bridgman-Stockbarger and Czochralski methods, growth proceeds from a melt to a solid. Because the liquidus-solidus curves for lead tin telluride are narrowly separated, the composition of a growing crystal differs from that of the melt from which it grows. Therefore, the resulting crystal does not have a uniform composition but varies, as will be more fully explained with reference to FIGS. 1 and 2.

These prior art techniques further give rise to defects and inhomogeneity as a result of constitutional supercooling. If a proper temperature coolant is not maintained at the solid liquid interface, precipitation of a tin rich phase takes place and gives rise to an undesirable cellular structure.

Other problems arise because these techniques require operation at high temperature in order to obtain the melt. Such high temperatures promote a greater likelihood that impurities will be leached, in particular from the crucible, especially in view of the large contact area between the crucible and the crystal. In addition, these methods require relatively elaborate and expensive equipment.

In the vapor transport method, the source, having the desired composition, is placed in a temperature gradient for sublimation and condensation on a colder surface. Because growth is initiated by spontaneous nucleation, success depends on the ability to obtain the smallest number of nucleation sites, the control of which is very difficult. Thus, this method usually results in the formation of many small points of nucleation at the tip of the tube and their eventual growth together to produce a crystal which is not a single crystal.

The present invention overcomes these and other problems by recognizing that compositional deviation and supercooling problems are avoided by growing a crystal at a constant, low temperature in an environment which minimizes contact between the forming single crystals and the crystal growth tube. Constitutional supercooling is absent since the growth is under near-equilibrium conditions.

SUMMARY OF THE INVENTION

I have disclosed a crystal growth process which yields large single crystals of $Pb_{1-x}$-$Sn_x$-Te of high purity that is substantially improved over prior art processes. The improvement over prior method consists of placing pre-reacted charge comprised of lead tin telluride mixtures in an evacuated environment having a small negative temperature gradient, i.e., the temperature is hotter at the bottom of the ampoule than it is at the top. This process is very reliable, requires a minimum of attention during crystal growth and yields unstrained large single crystals which are compositionally and crystallographically homogenious.

THE INVENTION

Figure 1:
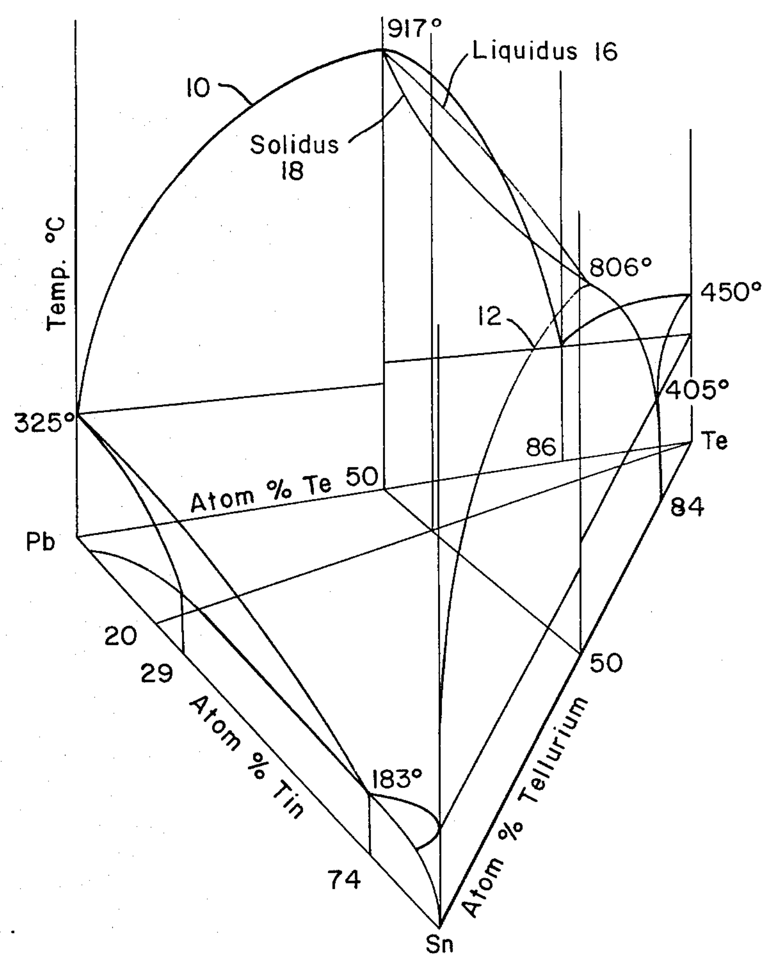
FIG. 1 is a three-dimensional phase diagram for lead tin telluride.

Briefly, the present invention enables large crystals of lead tin telluride to be grown from stoichiometric and non-stoichiometric sources. Lead, tin and tellurium are weighed and placed in a crucible which is thereafter evacuated and sealed. The materials are then reacted for a time and at a temperature sufficient to fully combine the ingredients. The reacted material is then broken into pieces which are used as a source material for the crystal forming step. One or more of these pieces is placed in a fused silica cup which is supported within an evacuated and sealed ampoule. The ampoule is placed in a furnace where the temperature is raised to a point which is approximately 50° C. below the maximum melting point of the charged materials and maintained such that a small negative temperature gradient exists during the growth process.

In my prior invention, disclosed in application Ser. No. 376,869, the ampoule is placed in a furnace within a uniform temperature zone to prevent transport of material from the cup. The temperature is raised to a point which is slightly above the solidus curve for the particular lead-tin ratio. Thus, the operating point on the temperature-composition phase diagram is chosen to provide a minute fraction of the liquid phase so that, in accordance with the lever rule, the solid is equilibrated with the melt which serves as a vehicle for diffusion and crystal growth by digestion. The small surface of contact with the cup and the relatively low growth temperature, as compared to prior art melt techniques, avoids the problem of leaching and facilitates extraction of the crystal product.

The change from a uniform temperature zone to a negative gradient within the furnace is responsible for the unexpectedly superior results obtained. The reliability of the crystal growth process was significantly increased.

At the initial stage of the growth, densification and minimization of surface area takes place by the disappearance of sharp edges and the transformation of the source material into a dome shaped mass which is flat at its bottom, in contact with the cup. Thereafter, facets appear on the top and at the sides while the bottom remains unfaceted. In the case of the crystals grown from a metal-rich source, the metal-rich amorphus phase drains to the bottom of the cup at the completion of the growth. In the case of growth from a stoichiometric source, normally the bottom remains amorphous or full of grain boundaries.

THEORY OF GROWTH PROCESS

Lead tin telluride ($Pb_{1-x}Sn_xTe$) is a pseudo-binary system of lead telluride and tin telluride which forms a solid solution over the entire compositional range wherein $0<X<1$. The two compounds, lead telluride and tin telluride, are mutually soluble in all proportions and the alloy has an energy gap which varies linearly with composition passing through zero and rising again with increasing tin telluride concentration. This energy gap variability, provided by adjustment of the lead to tin ratio, enables use of this composition for intense radiation sources and intrinsic photodetectors covering the wavelength region from about 5 $\mu$m to the far infrared, for injection laser action to about 28 $\mu$m, and for photovoltaic detection to 30 $\mu$m in lead tin telluride diodes. As a consequence, lead tin telluride has wide use such as for radiation detectors, e.g., in the infrared, laser materials, photosensitive devices, and, in general, semiconductor material.

This system is pseudo-binary because it comprises two compounds, lead telluride and tin telluride, together forming a solid solution in which the mole ratio of metals to tellurium is always equal to 1. As shown in FIG. I, the phase diagrams of lead telluride and tin telluride are respectively illustrated by curves 10 and 12 which peak at 917° C. and 806° C. respectively. The point at which both respectively peak is at approximately 50 mole or atom percent tellurium which indicates in both cases that the two compounds each comprise approximately 50% tellurium. These two compounds form a continuous solid solution of Type I. For purposes of information and comparison, lead and tin are shown to have a phase diagram 14.

Figure 2:
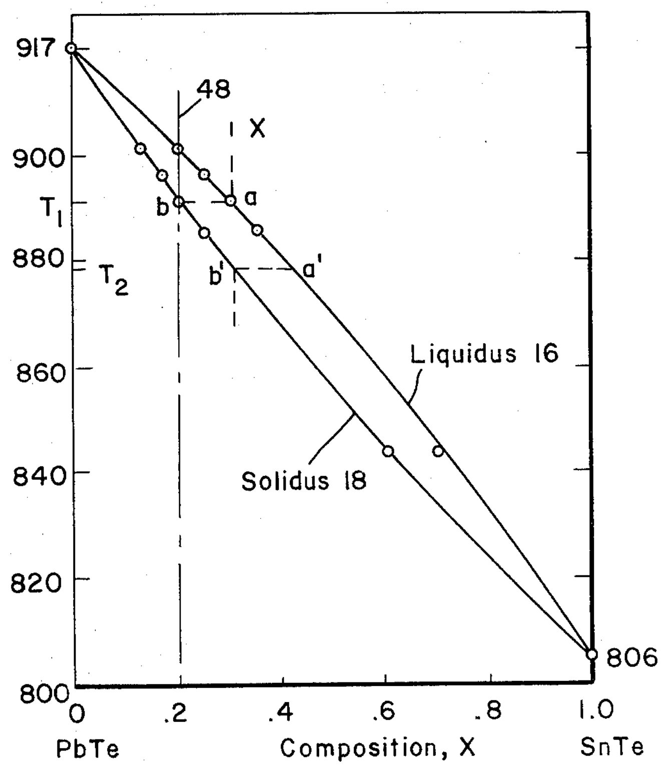
FIG. 2 is a phase diagram for lead tin telluride for 50 mole percent tellurium, as shown in FIG. 1.

For convenience of description and clarity of the present invention, reference is further directed to FIG. 2 which represents that portion of the phase diagram of FIG. 1 which lies within the plane bounded by the 50 atom percent of tellurium and including the liquidus-solidus curve. As shown in FIG. 2, which shows the phase diagram for the lead tin telluride system in terms of temperature versus composition, it is seen that the system has a liquidus curve 16 above which lead tin telluride exists as a liquid solution and a solidus curve 18 below which lead tin telluride exists as a solid solution. In between the liquidus and solidus curves, lead tin telluride exists partly as a liquid solution and partly as a solid solution. One end of the phase diagram shows pure lead telluride having a melting point of approximately 917° C. At the other end of the phase diagram is shown pure tin telluride having a melting point at approximately 806° C. Between these two extremes, wherein the composition x indicates mole percent of tin telluride, the liquidus-solidus curve exhibits a narrow separation.

It is because of this separation between liquidus and solidus curves 16 and 18 that the above noted problems have existed in the prior art techniques. Specifically, for purposes of example, it is assumed that the liquid solution of lead tin telluride has a tin composition of approximately 30 mole percent and at a temperature of approximately 910° C. This position is indicated at point x. As the temperature of the solution is reduced to $T_1$°C., the mole percent of tin remains the same until the liquidus curve is met at point a, showing 30 mole percent tin and 70 mole percent lead. However, the solid solution of lead tin telluride shown another composition at point b, having an approximate composition of 20 mole percent tin and 80 mole percent lead. As formation of the compounds continues through a decreasing temperature to $T_2$°C., the liquid solution moves from point a to point a′, having a composition of approximatey 41 mole percent tin and 59 mole percent lead. This temperature corresponds to a solid solution composition b′ of approximately 30 mole percent tin and 70 mole percent lead. As a consequence of the decreasing temperature, the solid solution varies in composition from 20 mole percent tin to 30 mole percent tin. Thus, the composition is not uniform and, therefore, of low quality. The present invention overcomes this problem as well as others by obtaining crystal growth at a constant temperature, as will hereinafter be described.

PREFERRED EMBODIMENT

Figure 3:
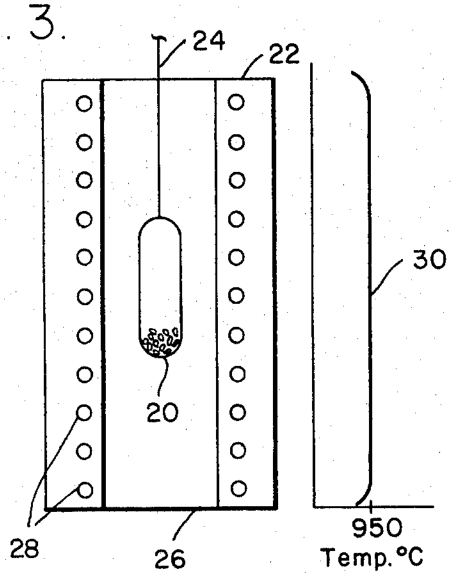
FIG. 3 schematically represents a furnace and a temperature curve for providing the source material.
Figure 7:
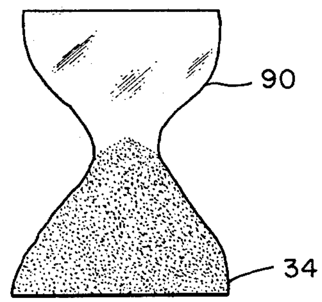
FIG. 7 is a drawing of a cross-section of an actual crystal growth by the present invention.
Figure 4:
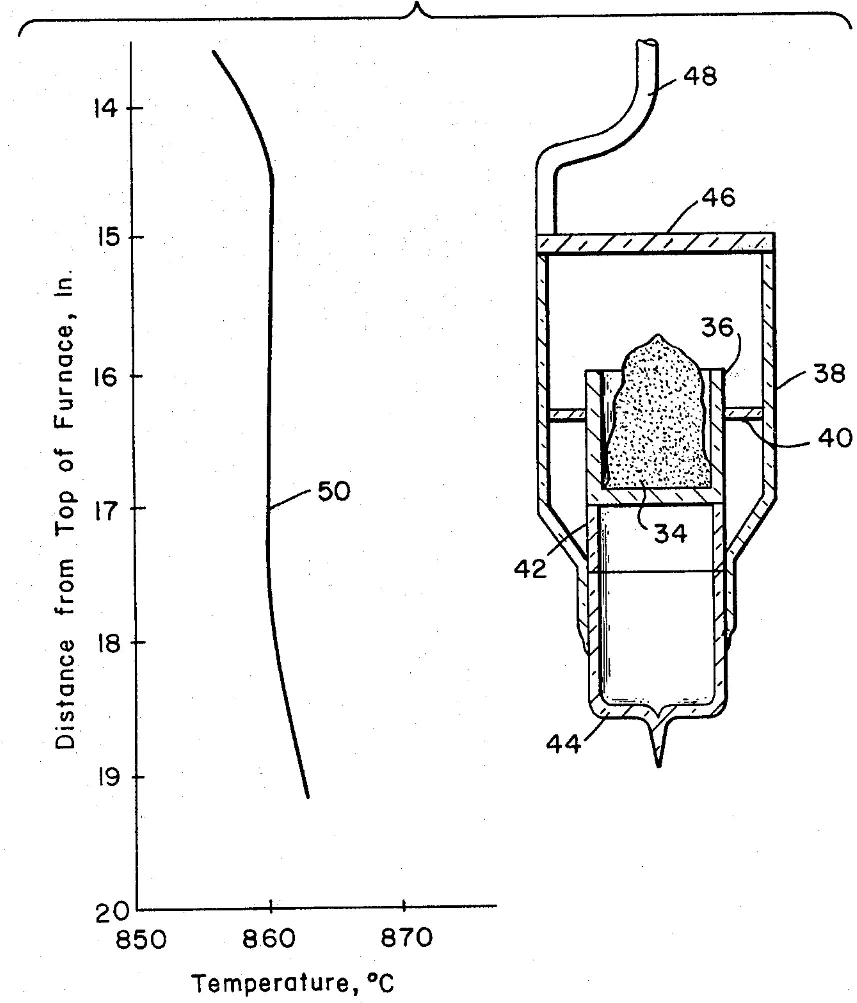
FIG. 4 schematically depicts a crystal growth ampoule and its position in the furnace relative to the temperature profile outlines the furnace.
Figure 5:
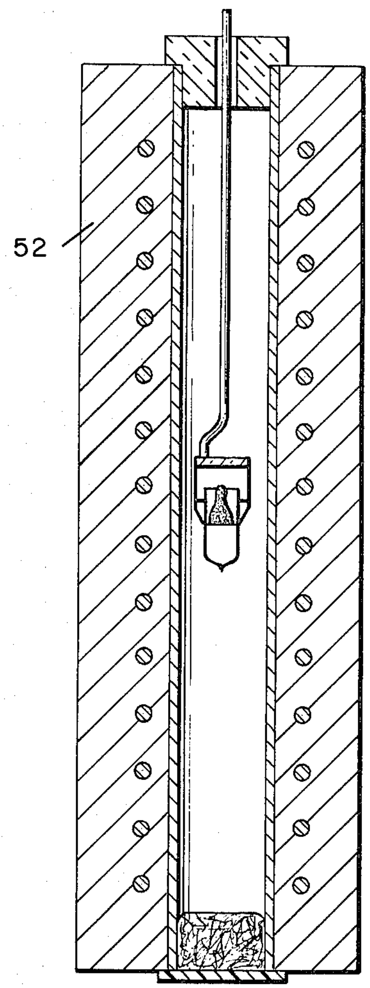
FIG. 5 is schematic representation of a furnace having a crystal growth ampoule.

Specifically, the present invention is conducted particularly with respect to three steps illustrated with respect to the drawings of FIGS. 3 and 4. Source material is prepared in the furnace depicted in FIG. 3, the single crystal is prepared in the furnace depicted in FIG. 4.

Accordingly, with reference to FIG. 3, specific amounts of lead, tin and tellurium of 99.9999% purity are mixed and placed in an ampoule 20 of quartz or vitreous carbon. The ampoule is evacuated to approximately $10^{-6}$ Torr. and suspended within a furnace 22 by means of a rod 24. The furnace is sealed at ends 26 to prevent formation of convection currents. The furnace is heated by means of coil 28 or other suitable means to provide a temperature approximately 50° C. above the melting point as indicated by isothermal curve 30. If desired, the furnace temperature may be one or two degrees higher at its upper end than at its lower end to provide a slight but flat temperature gradient in order to prevent vapor transport in tube 20. The mixture 32 of lead, tin and tellurium is held at this temperature for approximately four hours. The ampoule is then quenched in water to ambient temperature and the reacted material is broken into pieces for use as a source material. A clean mortar and pestle is suitable for this purpose.

One such piece of lead tin telluride source material is indicated by numeral 34 of FIG. 4 which is placed within a quartz cup 36 open at its upper end. The quartz cup is positioned centrally within a growth tube 38 of quartz with rods 40 and supported by rods 42 from the bottom cup 44 which is open at the top. The tube is capped with a quartz window 46 to enable observation of the growth.

The evacuated and sealed tube with its contents is then placed within a furnace 52 and supported by a rod 48. The furnace 52 is provided with heating elements or the like capable of providing a negative temperature gradient. The temperature of the furnace is raised to within 50° C. of the melting point of the charged materials at the bottom of the ampoule and maintained for a period of 14–21 days on the average, during which time the source material 34 is converted into a single crystal. The method described with respect to FIG. 4 is carried out in the liquid-solid two-phase or solid regions.

The method described with respect to FIG. 4 is carried out in the liquid solid two-phase or solid regions.

Figure 6:
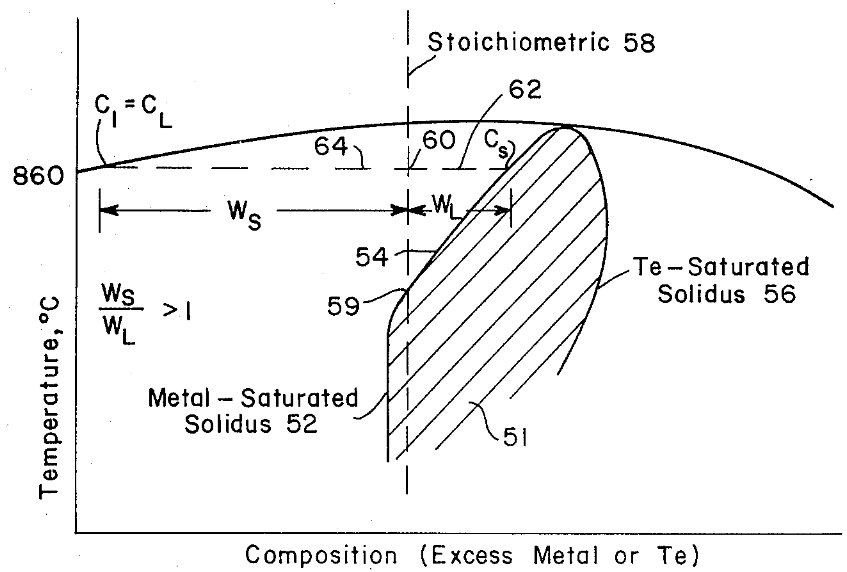
FIG. 6 depicts the expanded temperature-composition diagram for lead tin telluride taken along any vertical perpendicular of FIG. 2.

In order to further understand the physical changes which are being undergone during crystal growth, reference is directed to FIG. 6, which depicts that portion of the phase diagram of FIG. 1 and taken along any plane, such as plane 48, of FIG. 2. Thus, even though FIG. 2 does not show a solidus interface at 860° C. at a tin composition of approximately 20 mole percent, solidus curve 18 does not extend perpendicular to the plane of FIG. 2 but has a slope as shown in FIG. 6. Therefore, the solidus portion of lead tin telluride is shown as the shaded portion indicated by indicium 50 encompassed within a solidus curve 52 having a metal saturated solidus curve portion 54 and a tellurium saturated solidus curve portion 56. Line 58 indicates stoichiometric composition of metal to tellurium and, at any point on this straight line and within the shaded portion 50, the resulting crystal is intrinsic. However, the present invention operates at temperatures which are higher than the highest intrinsic temperature point shown by indicium 59, that is, at the temperature referenced by indicium 60. This point 60 indicates that source material 34 being crystallized lies very slightly above solidus curve 54 (a portion of curve 18 of FIG. 2) and substantially below liquidus curve 16. Thus, the system physically has a very small liquid fraction $W_L$, as shown by line segment 62, and a large solid fraction $W_S$, as shown by line segment 64. The choice of the particular temperature of 860° C. permits working of the present invention to obtain crystal growth within a reasonable period of time. It is possible to utilize a higher temperature; however, higher temperatures proportionately increase the metal vacancy concentration in the crystal. Such metal vacancy concentration produces undesirable electrical properties in the crystal. Also, higher temperatures increase the likelihood of increased leaching of impurities from the crucible.

During the 2–3 week growth period approximately 50° C. below the melting point the prereacted charge transforms into a dome shape to minimize the surface free energy. When the charge is compounded such that the composition lies on the left of point $C_S$ in the liquid solid region but not too far from point $C_S$ the liquid fraction $W_L$ having the composition $C_L$ coalesce and drains to the bottom of the cup. The solid fraction $W_S$ having the composition $C_S$ undergoes recrystallization, that is large grains grow at the expense of small grains. Concurrently, a facet or facets develop at the upper portion of the charge. Because of the small negative temperature gradient, the temperature decreases from the bottom to the top of the charge, a condition conducive to vapor transport and mass diffusion, the charge begins to transport on the facet, normally on the facet that formed on the top of the dome shaped charge. The growth, which can be observed from the top through the quartz window, is terminated before the crystal becomes too large for the polycrystalline charge supporting the crystal. The growth is terminated by slowly lowering the temperature of the furnace. Normally, the furnace is cooled to ambient temperature in two days to minimize straining of the crystal.

The salient feature of this growth method compared with the previously discussed method is that the yield of single crystal growth is considerably higher owing to the condition provided, that is the slight negative temperature gradient which promotes vapor transport and mass diffusion processes.

What is claimed is:

1. A method of growing a large single crystal of $Pb_{1-x}Sn_x$-Te, at near equilibrium conditions where $0<X<1$, from a polycrystalline charge of $Pb_{1-x}Sn_x$-Te comprising;

placing said charge into an opened end container;

positioning said container within a crystal growth ampoule;

evacuating and subsequently sealing said ampoule;

creating a preselected negative thermal gradient at a temperature approximately 50° C. below the melting point of said charge which extends along the vertical axis of said ampoule by placing said ampoule into a furnace, preset to provide such a gradient, maintaining said thermal gradient for a period of from one to four weeks whereby said polycrystalline charge will be converted into a monocrystal, and allowing said monocrystal to slowly cool to ambient temperatures prior to removing it from said ampoule and said container by removing said ampoule from said furnace.

2. The method of claim 1 wherein said temperature gradient ranges from 50° C. below the melting point of said charge at the bottom of said ampoule to 52° C. below the melting point of said charge at the top of the ampoule.

* * * * *